United States Patent
Shelnutt et al.

(10) Patent No.: US 10,194,562 B2
(45) Date of Patent: Jan. 29, 2019

(54) SYSTEM AND METHOD FOR MITIGATING CONDENSATION IN A LIQUID COOLED INFORMATION HANDLING SYSTEM

(71) Applicant: DELL PRODUCTS, LP, Round Rock, TX (US)

(72) Inventors: Austin M. Shelnutt, Leander, TX (US); Edmond I. Bailey, Cedar Park, TX (US); John R. Stuewe, Round Rock, TX (US)

(73) Assignee: Dell Products, LP, Round Rock, TX (US)

( * ) Notice: Subject to any disclaimer, the term of this patent is extended or adjusted under 35 U.S.C. 154(b) by 130 days.

(21) Appl. No.: 15/093,968

(22) Filed: Apr. 8, 2016

(65) Prior Publication Data
US 2017/0295677 A1    Oct. 12, 2017

(51) Int. Cl.
H05K 7/20    (2006.01)

(52) U.S. Cl.
CPC ............... *H05K 7/20836* (2013.01)

(58) Field of Classification Search
CPC ......... H05K 7/2029; H05K 7/20609; H05K 7/20627; H05K 7/20763; H05K 7/208; H05K 7/20863; F24F 13/22; F24F 2013/221; Y10S 165/921
USPC ...................................................... 165/230
See application file for complete search history.

(56) References Cited

U.S. PATENT DOCUMENTS

| | | | |
|---|---|---|---|
| 4,512,161 A * | 4/1985 | Logan | G05D 23/1393 236/44 R |
| 7,062,938 B2 | 6/2006 | Lee | |
| 2008/0310112 A1* | 12/2008 | Long | H05K 5/0213 361/701 |
| 2009/0234705 A1* | 9/2009 | Brunschwiler | G06F 1/206 62/259.2 |
| 2012/0129441 A1 | 5/2012 | Peng et al. | |

OTHER PUBLICATIONS

U.S. Appl. No. 15/017,604, filed Feb. 6, 2016.
U.S. Appl. No. 15/017,607, filed Feb. 6, 2016.
U.S. Appl. No. 15/017,582, filed Feb. 5, 2016.
U.S. Appl. No. 15/017,492, filed Feb. 5, 2016.
U.S. Appl. No. 15/017,405, filed Feb. 5, 2016.
U.S. Appl. No. 15/017,451, filed Feb. 5, 2016.
U.S. Appl. No. 15/016,249, filed Feb. 4, 2016.
U.S. Appl. No. 15/016,234, filed Feb. 4, 2016.

* cited by examiner

*Primary Examiner* — Marc Norman
(74) *Attorney, Agent, or Firm* — Larson Newman, LLP

(57) ABSTRACT

A dew point of air entering an information handling system is determined based on the temperature and humidity of the air. Also determined is a temperature of facility cooling water entering the information handling system. A condensation mitigation procedure is activated if a difference between the temperature of the facility cooling water and the dew point temperature is less than a first threshold value. The condensation mitigation procedure includes reducing a flow-rate of the facility cooling water to a liquid manifold using a valve. The liquid manifold is in thermally-conductive contact with a heat-generating component included at the information handling system.

20 Claims, 6 Drawing Sheets

SYSTEM AND METHOD FOR MITIGATING CONDENSATION IN A LIQUID COOLED INFORMATION HANDLING SYSTEM

FIELD OF THE DISCLOSURE

This disclosure relates generally to information handling systems, and more particularly relates to mitigating condensation in a liquid cooled information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A dew point of air entering an information handling system is determined based on the temperature and humidity of the air. Also determined is a temperature of facility cooling water entering the information handling system. A condensation mitigation procedure is activated if a difference between the temperature of the facility cooling water and the dew point temperature is less than a first threshold value. The condensation mitigation procedure includes reducing a flow-rate of the facility cooling water to a liquid manifold using a valve. The liquid manifold is in thermally-conductive contact with a heat-generating component included at the information handling system.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

Figure 1:
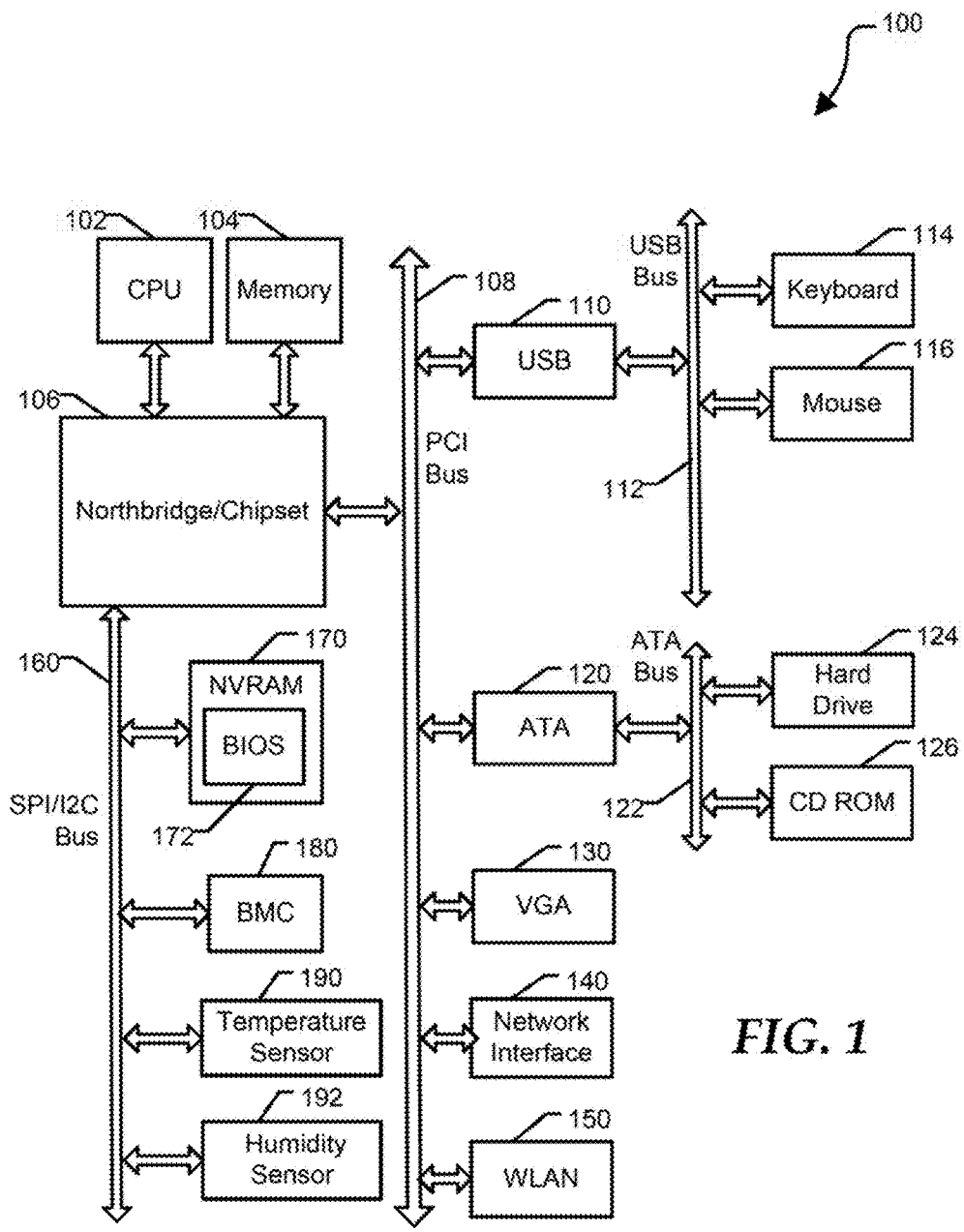
FIG. 1 is a block diagram of an information handling system according to an embodiment of the present disclosure.

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

FIGS. 1-6 illustrate techniques for mitigating condensation at an information handling system. An information handling system typically includes components, such as central processing units, memory devices, and the like, that generate heat during operation. For reliability and performance reasons, the generated heat needs to be dissipated from the heat-generating components. One technique for removing the heat includes circulating cold water through a liquid manifold that is in thermally-conductive contact with the heat-generating component. Traditionally, the liquid flows through a closed system local to the information handling system or local to individual nodes installed in the information handling system. Liquid-to-liquid or air-to-liquid heat exchangers can be used to extract heat from the circulating liquid. As disclosed herein, facility cooling water is provided to the liquid manifold. However, if the facility cooling water is too cold relative to the dew point of air circulating through the information handling system, condensation can form within the system.

To mitigate condensation, a proportional valve is situated between the supply of facility cooling water and the liquid manifold, and the flow rate of coolant through the manifold is adjusted using the valve based on the temperature of the facility cooling water and the current dew point of air entering the system. For example, the valve can be configured to provide a maximum flow rate when the temperature of the facility cooling water is significantly higher than the dew point of air circulating through the information handling system. The dew point can be calculated using a temperature sensor and a humidity sensor located at or near the information handling system. Another temperature sensor can monitor the temperature of the facility cooling water, for example where the water enters the system. A controller, such as an embedded processor, can continuously or periodically compare the temperature of the facility cooling water to the calculated dew point, and initiate a condensation mitigation procedure if the temperature of the facility cooling water approaches the a dew point temperature. For example, if the controller determines that a difference between the temperature of the facility cooling water and the current dew point temperature is less than a programmable threshold value, the condensation mitigation procedure can reduce a flow-rate of facility cooling water provided to the liquid manifold using the valve. In an embodiment, a flow rate enabled by the valve can be proportional to the difference between the temperature of the facility cooling water and the current dew point temperature. For example, the valve can be incrementally adjusted towards a closed condition if an increasing dew point or falling temperature of the facility cooling water causes the disparity between the dew point and the temperature of the facility cooling water to be reduced.

FIG. 1 illustrates an information handling system 100 including a central processing unit (CPU) 102, a memory 104, a northbridge/chipset 106, a PCI bus 108, a universal serial bus (USB) controller 110, a USB 112, a keyboard device controller 114, a mouse device controller 116, a configuration an ATA bus controller 120, an ATA bus 122, a hard drive device controller 124, a compact disk read only memory (CD ROM) device controller 126, a video graphics array (VGA) device controller 130, a network interface controller (NIC) 140, a wireless local area network (WLAN) controller 150, a serial peripheral interface (SPI) bus 160, a NVRAM 170 for storing BIOS 172, a baseboard management controller (BMC) 180, temperature sensor 190 and humidity sensor 192. BMC 180 can be referred to as a service processor or embedded controller (EC). Capabilities and functions provided by BMC 180 can vary considerably based on the type of information handling system. For example, the term baseboard management system is often used to describe an embedded processor included at a server, while an embedded controller is more likely to be found in a consumer-level device. As disclosed herein, BMC 180 represents a processing device different from CPU 102, which provides various management functions for information handling system 100. For example, an embedded controller may be responsible for power management, cooling management, and the like.

System 100 can include additional processors (not shown at FIG. 1) that are configured to provide localized or specific control functions, such as a battery management controller. Bus 160 can include one or more busses, including an I2C bus, a system management bus (SMBUS), a power management bus (PMBUS), and the like. BMC 180 can be configured to provide out-of-band access to devices at information handling system 100. As used herein, out-of-band access herein refers to operations performed prior to execution of BIOS 172 by processor 102 to initialize operation of system 100.

BIOS 172 can be referred to as a firmware image, and the term BIOS is herein used interchangeably with the term firmware image, or simply firmware. BIOS 172 includes instructions executable by CPU 102 to initialize and test the hardware components of system 100, and to load a boot loader or an operating system (OS) from a mass storage device. BIOS 172 additionally provides an abstraction layer for the hardware, i.e. a consistent way for application programs and operating systems to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device.

Information handling system 100 can include additional components and additional busses, not shown for clarity. For example, system 100 can include multiple processor cores, audio devices, and the like. While a particular arrangement of bus technologies and interconnections is illustrated for the purpose of example, one of skill will appreciate that the techniques disclosed herein are applicable to other system architectures. System 100 can include multiple CPUs and redundant bus controllers. One ore more components can be integrated together. For example, portions of northbridge/chipset 106 can be integrated within CPU 102. Additional components of information handling system 100 can include one or more storage devices that can store machine-executable code, one or more communications ports for communicating with external devices, and various input and output (I/O) devices, such as a keyboard, a mouse, and a video display.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as CPU 102, a programmable logic array (PLA), an embedded device such as a System-on-a-Chip (SoC), or other control logic hardware. Information handling system 100 can also include one or more computer-readable medium for storing machine-executable code, such as software or data.

Techniques described herein are especially well suited for use in a Rack-based Information Handling System (RIHS), which generally refers to the configuration of a large scale server system within a physical rack having multiple chassis receiving rails for receiving specific sizes of information technology (IT) nodes, such as server modules, storage modules, Peripheral Component Interconnect-Express (PCIe) cards, and power modules. The term generally refers to each separate unit inserted into a 1U for other height rack space with the rack. In one embodiment, operational characteristics of the various IT nodes can be collectively controlled by a single rack level controller. Alternatively, an embedded controller can be associated with each IT node or with a subset of IT nodes within the rack. In an embodiment, the embedded controller can monitor the dew point temperature of air in the vicinity of one or more nodes, the temperature of the incoming facility cooling water, and proportionally control a flow rate of cooling water to various cooling manifolds included at each IT node.

Figure 2:
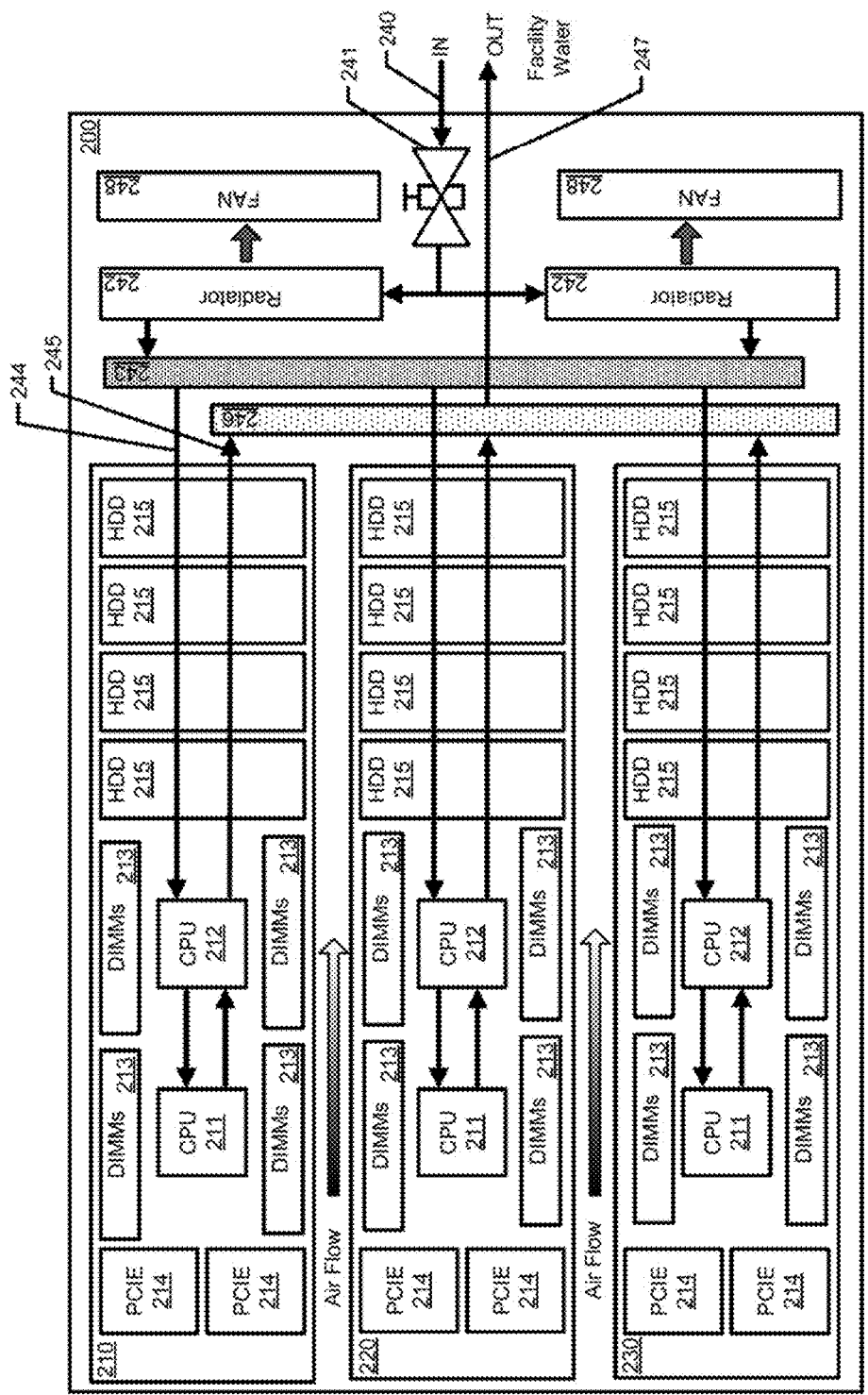
FIG. 2 is a block diagram of a server chassis including a facility water cooling system according to an embodiment of the present disclosure.

FIG. 2 shows a server chassis 200 including a facility water cooling system according to an embodiment of the present disclosure. Chassis 200 includes IT nodes 210, 220, and 230. Chassis 200 may represent a portion of a larger RIHS that includes many IT nodes. Each IT node includes CPUs 211 and 212, dual in-line memory modules (DIMMs) 213, Peripheral Component Interconnect Express (PCIE) devices 214, and hard disk drives (HDDs) 215. An IT node can include different components based on the nodes purpose. While most components included in an IT node generate heat during operation, for the purpose of this example, CPUs 211 and 212 are equipped with a liquid manifold (not shown in FIG. 2) to provide cooling, while the other components included in the are cooled by air circulating through the node. Chassis 200 further includes a intake 240 for receiving facility cooling water, a valve 241, radiators 242, a supply manifold 243, a supply conduit 244 to deliver cool water to the liquid manifolds that are in thermally-conductive contact with CPUs 211 and 212, a return conduit 245 coupled to a return manifold 246, a coolant output 247, and fans 248. Radiators 242 can be referred to as air-to-liquid heat exchangers.

During operation of chassis 200, fans 248 pull air into the front of chassis 200 (left side of chassis 200 depicted at FIG. 2) and exhaust air out of the rear side of the chassis (right side at FIG. 2). Facility cooling water circulates from intake 240, through radiators 242 and the liquid manifolds associated with CPUs 211 and 212, exiting at output 247. Air drawn into chassis 200 by fans 248 is heated as it circulates over components in nodes 210-230. All or a portion of this heat is removed from the air as it passes through radiators 242 before being exhausted back into the chassis environment. The flow rate of facility cooling water is regulated by valve 241. The facility cooling water circulates through the liquid manifolds coupled to CPUs 211 and 212, extracting heat generated by the CPUs. For clarity, only CPUs 211 and 212 are shown equipped with liquid cooling manifolds, however other components included at IT nodes 210-210, or other components associated with chassis 200 (not shown at FIG. 2) can be cooled by the liquid cooling system. In an embodiment, valve 241 is configured to provide a variable flow-rate of facility cooling water through various cooling manifolds at chassis 200 based on a difference between a temperature of the facility cooling water and a dew point of air entering the chassis.

As used herein, facility cooling water is chilled water provided by a central water chilling system. For example, the central chilling system can provide chilled water to a building air conditioning system, or can be dedicated to providing chilled water to all or a portion of a server/data center. Alternatively, facility cooling water can be provided by a utility or service provider. As disclosed herein, the facility cooling water is provided to the various cooling manifolds included at chassis 200 without the use of liquid-to-liquid heat exchangers and closed-loop coolant conduits. Chassis 200 can include liquid-to-liquid heat exchangers, closed-loop coolant systems, heat pipes and heat spreaders, and the like, to provide additional cooling services. The particular coolant conduits, manifolds, and plumbing of the coolant system shown in FIG. 2 can vary without departing from the present disclosure, so long as a valve is used to regulate a flow rate of facility cooling water through a manifold that is thermally coupled to a heat-generating component.

Figure 3:
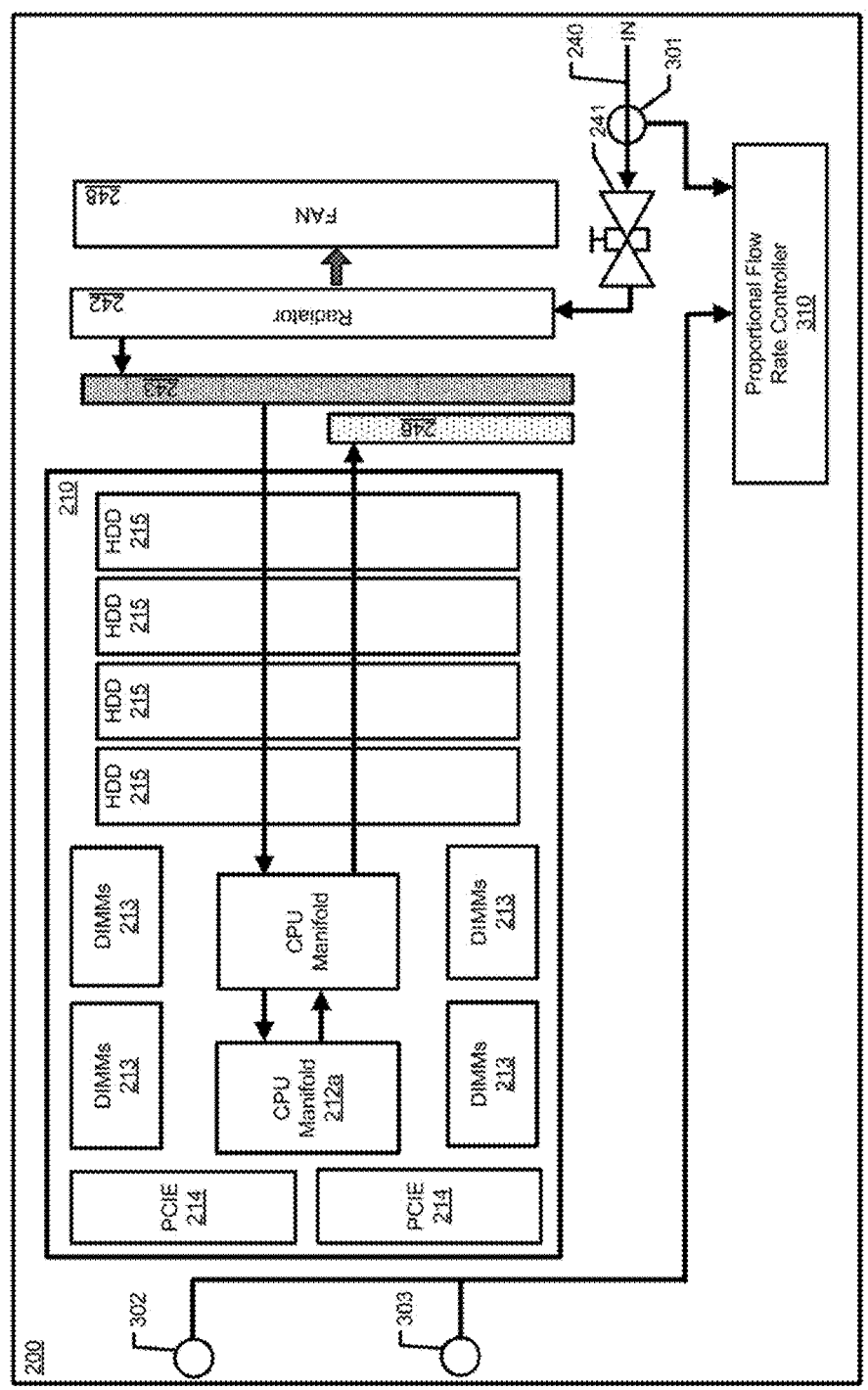
FIG. 3 is a block diagram of the server chassis of FIG. 2 according to another embodiment of the present disclosure.

FIG. 3 shows server chassis 200 according to another embodiment of the present disclosure. FIG. 3 includes IT node 210, other components of FIG. 2, temperature sensors 301 and 302, a humidity sensor 303, and a proportional flow rate controller 310. Some of the components of FIG. 2 are not shown, for clarity. Liquid manifolds 211a and 212a are illustrated, thermally coupled to CPUs 211 and 212, respectively. During operation, temperature sensor 301 can monitor the temperature of facility cooling water entering chassis 200 at or near inlet 240. Alternatively, temperature sensor 301 can be located after radiator 242 or after supply manifold 243. Temperature sensor 302 is configured to measure the temperature of air entering, or inside, chassis 200; and humidity sensor 303 is configured to measure the humidity of air entering or inside chassis 200. Proportional flow rate controller 310 can include an embedded controller, or can be a process executed at another processor, such as BMC 180. Controller 310 can calculate a dew point of air flowing through chassis 200 based on the temperature information provided by temperature sensor 302 and humidity information provided by humidity sensor 303. Controller 310 can determine a difference between the temperature of the incoming facility cooling water and the calculated dew point, and compare that difference to a threshold value. For example, controller 310 can configure valve 241 to provide a maximum flow rate of facility cooling water to CPU manifolds 211a and 212a if the difference between the dew point and the coolant temperature exceeds a threshold, such as 2° C., and begin throttling the flow rate if the difference is less than the threshold. In an embodiment, controller 300 can configure valve 241 to provide a continuous range of flow rates proportional to the difference between the coolant temperature and the dew point. The flow rate reduction can be linear or nonlinear relative to the difference between the coolant temperature and the dew point.

Chassis 200 can include multiple temperature sensors for monitoring operating temperature of temperature-critical components included at the chassis and at individual IT nodes. Humidity sensor 303 is typically responsive to relative humidity; however a sensor capable of measuring absolute humidity or an approximation of either relative or absolute humidity can be utilized. For simplicity, the term humidity is used herein to mean any form of humidity measurement. A dew temperature, also referred to as a dew point temperature, or simply dew point, can be approximated using the equation:

$$Td = T - (100 - RH/5) \qquad (1)$$

Where Td is the dew temperature, T is the current or average temperature, and RH is the current or average relative humidity. This approximation is most accurate for values of relative humidity that are greater than fifty percent. In one embodiment, calculation of a dew point can be performed in response to the relative humidity increasing beyond a predetermined threshold, such as fifty percent.

Figure 4:
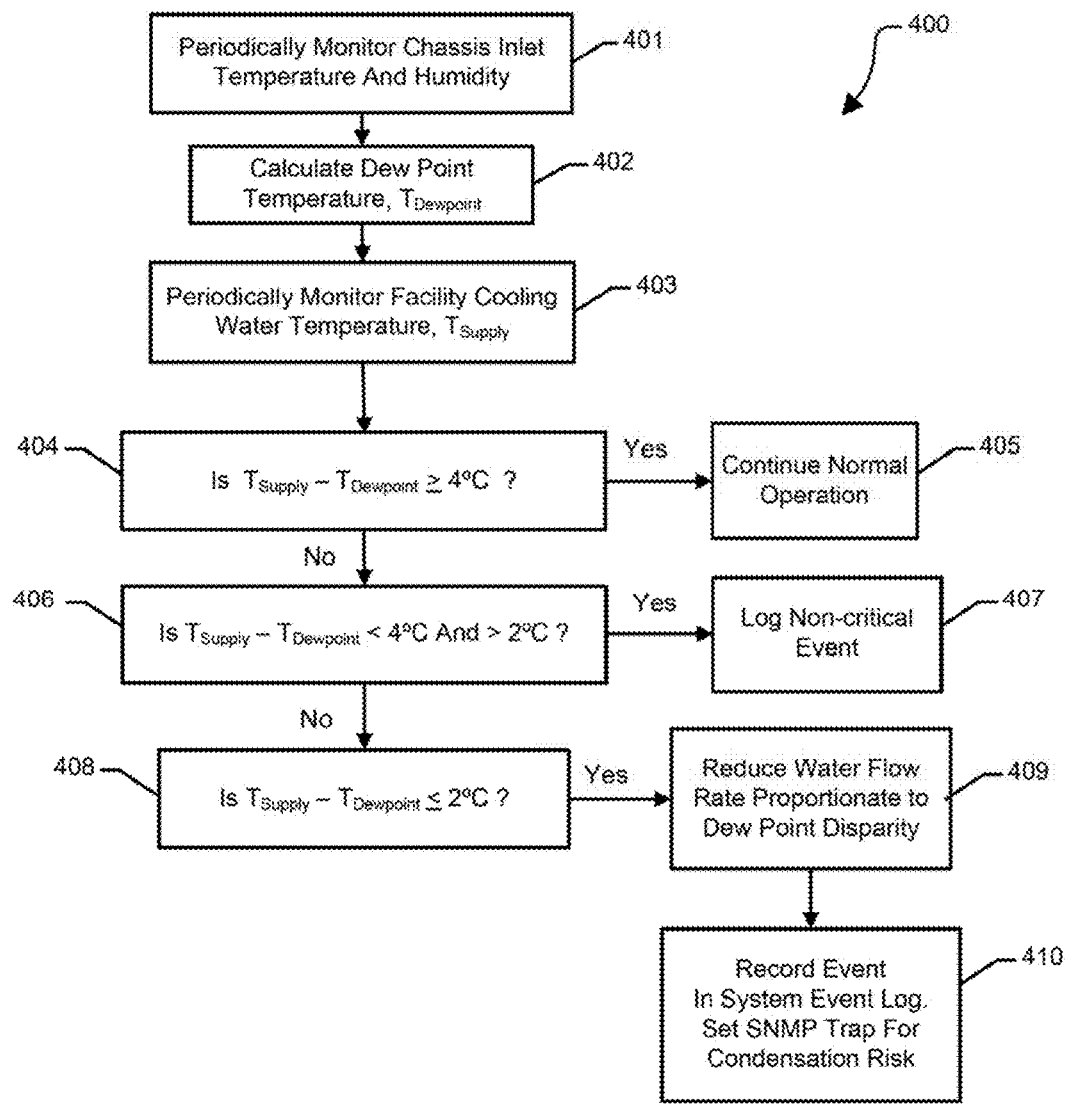
FIG. 4 is a flow diagram illustrating a method for preventing condensation at the server chassis of FIG. 2 according to a specific embodiment of the present disclosure.

FIG. 4 shows a method 400 for preventing condensation at the server chassis of FIG. 2 according to a specific embodiment of the present disclosure. Method 400 begins at block 401 where the temperature and humidity of air entering an information handling system is measured. For example, proportional flow rate controller can continuously or periodically acquire temperature and humidity information from sensor 302 and 303, respectively. The method proceeds to block 402 where a dew point of the air entering the system is calculated based on the temperature and humidity information acquired at block 401. At block 403, the temperature of facility cooling water entering the information handling system is monitored, for example using temperature sensor 301. At block 404, it is determined whether the difference between the temperature of the facility cooling water, $T_{Supply}$, and the calculated dew point, $T_{Dewpoint}$ is greater than 4° C. If the difference is greater than 4° C., the method continues at block 405 where normal operation of the cooling system continues. For example, controller 310 can configure valve 241 to maintain a normal or maximum flow rate of coolant through manifolds 211a and 212a.

At block 406, it is determined whether the difference between $T_{Supply}$ and $T_{Dewpoint}$ is less than 4° C. and greater than 2° C. If the difference falls within this range, the method continues at block 407 where controller 310 can generate a log entry identifying a non-critical event. At block 408, it is determined whether the difference between $T_{Supply}$ and $T_{Dewpoint}$ is less than or equal to 2° C. If the difference is less than 2° C. the method proceeds to block 409 where controller 310 configures valve 241 so as to reduce the flow rate of coolant through manifolds 211a and 212a proportionate to the degree of disparity. For example, controller 310 can throttle the flow rate provided by valve 241 to fifty percent of maximum if the difference between $T_{Supply}$ and $T_{Dewpoint}$ is equal to 1° C. Method 400 completes at block 410 where a record of a condensation risk is added to a system event log, and a Simple Network Management Protocol (SNMP) trap is asserted. One of skill will appreciate that the specific threshold values and logging events are merely exemplary, and different thresholds and controller responses may be selected. In an embodiment, the various thresholds can be programmable and stored in a register accessible to controller 310.

Figure 5:
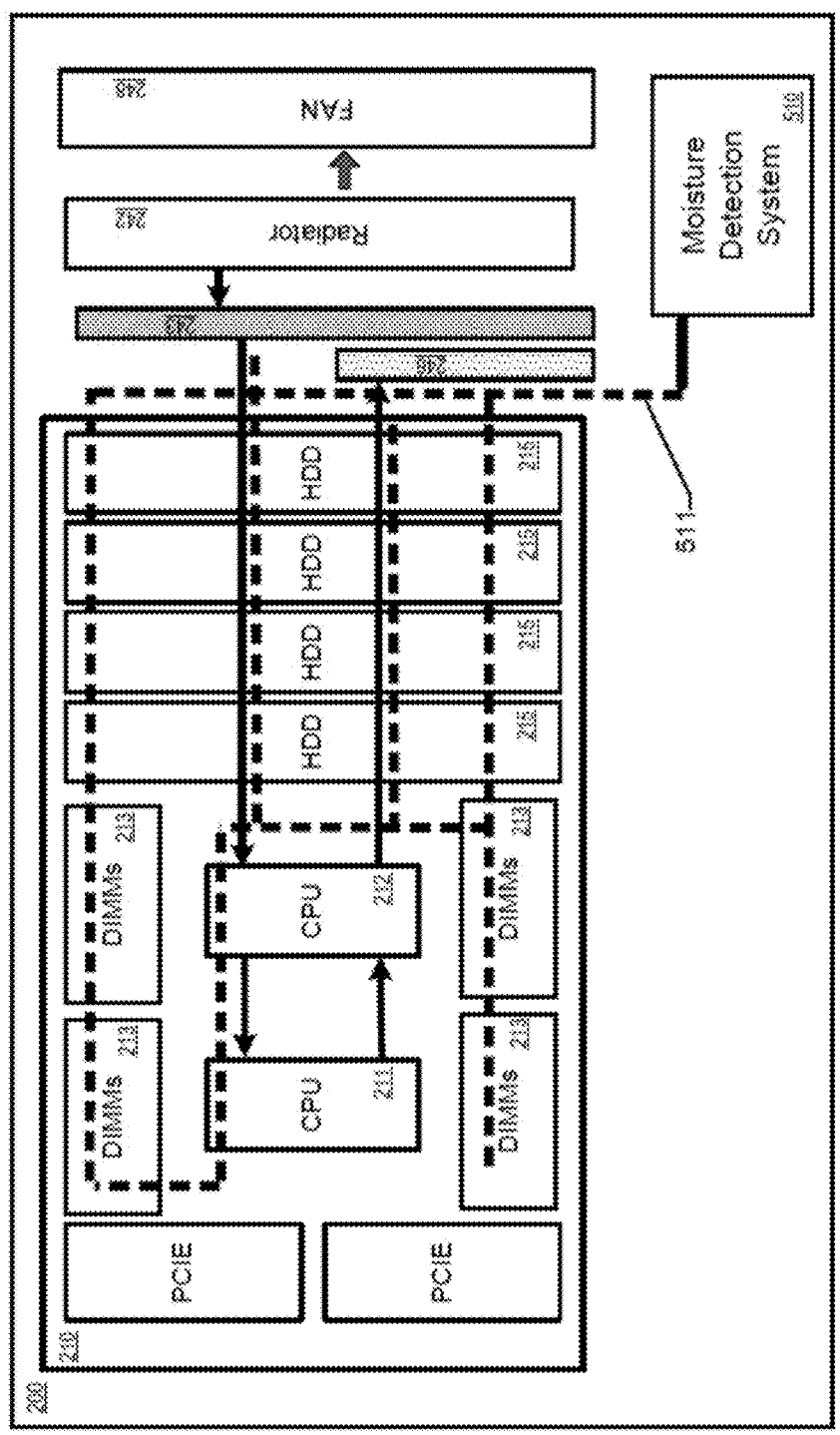
FIG. 5 is a block diagram of the server chassis of FIG. 2 according to yet another embodiment of the present disclosure.

FIG. 5 shows server chassis 200 according to still another embodiment of the present disclosure. FIG. 5 includes IT node 210, other components of FIG. 2, a moisture detection system 510, and a moisture detection wire 511. Some of the components of FIG. 2 are not shown, for clarity. Detection wire 511 typically includes a pair of conductors. Detection wire 511 can be routed within each IT core, such as at a location where condensation may be likely to form. For example, condensation may be likely to accumulate along conduit 244 that is supplying cooling water to CPU manifolds 211a and 212a. Moisture detection system 510 can detect when liquid water bridges the conductors, and initiate an appropriate response. For example, moisture detection system 510 can signal BMC 180, flow rate controller 310, or another system controller.

Figure 6:
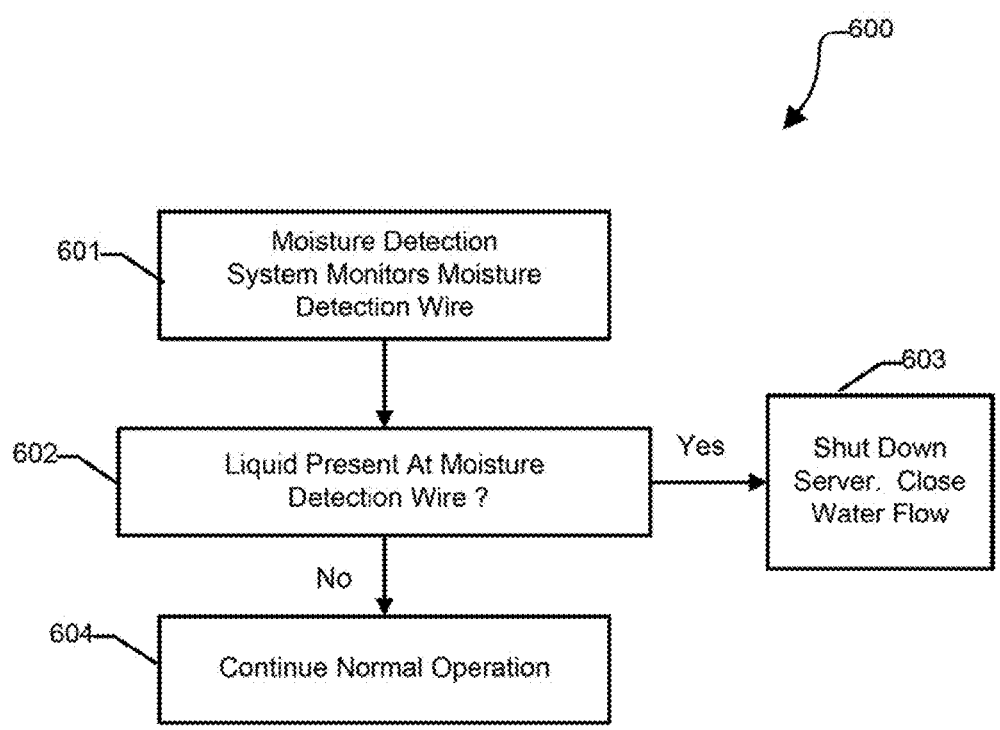
FIG. 6 is a flow diagram illustrating a method for detecting condensation at the server chassis of FIG. 2 according to a specific embodiment of the present disclosure.

FIG. 6 shows a method 600 for detecting condensation at the server chassis of FIG. 2 according to a specific embodiment of the present disclosure. Method 600 begins at block 601 where a moisture detection system monitors a moisture detection wire. At block 602, if moisture is detected, the method continues at block 603 where one or all IT nodes included at a chassis are shut down and the flow of coolant water is terminated. For example, if moisture detection system 510 determines that liquid water is in contact with moisture detection wire 511, system 510 can signal proportional flow rate controller 310 to fully close valve 241 so that no coolant is provided to IT nodes 210-212, and signal a primary rack controller to immediately shut down all or a portion of the IT nodes in the vicinity of the detected condensation. Emergency event signals would likely be forwarded to data center management systems and personnel. Returning to block 602, if no condensation is detected, normal operation of IT nodes 210-212 can continue.

Referring back to FIG. 1, the information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

The information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media. A network interface device (not shown at FIG. 1) can provide connectivity to a network, such as a wide area network (WAN), a local area network (LAN), or other network.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories.

Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
   an information technology node including a heat-generating component;
   a liquid manifold in thermally-conductive contact with the heat-generating component;
   a valve to couple facility cooling water to the liquid manifold;
   a first temperature sensor to provide first temperature information specifying a temperature of air entering the information handling system;
   a humidity sensor to provide humidity information specifying a humidity of the air entering the information handling system;
   a second temperature sensor indicating a temperature of the facility cooling water; and
   a processor configured to:
      determine a dew point temperature based on the first temperature information and the humidity information; and
      activate a condensation mitigation procedure if a difference between the temperature of the facility cooling water and the dew point temperature is less than a first threshold value stored at the information handling system, the condensation mitigation procedure to reduce a flow-rate of the facility cooling water to the liquid manifold using the valve.

2. The system of claim 1, wherein a flow rate regulated by the valve is proportional to the difference between the temperature of the facility cooling water and the dew point temperature.

3. The system of claim 1, further comprising:
   a fan to draw air through the information technology node; and
   an air-to-liquid heat exchanger coupled to the valve, the exchanger configured to receive the facility cooling water and to cool air exhausted from the information technology node.

4. The system of claim 1, wherein the condensation mitigation procedure is further to assert a warning indicator.

5. The system of claim 1, wherein the processor is further configured to update a system event log identifying a non-critical event in response to determining a difference between the temperature of the facility cooling water and the dew point temperature is greater than the first threshold value and less than a second threshold value.

6. The system of claim 1, wherein the processor is further configured to initiate shut down operation of the information technology node in response to determining a difference between the temperature of the facility cooling water and the dew point temperature is less than a second threshold value stored at the information handling system, the second threshold less than the first threshold.

7. The system of claim 1, further comprising:
   a moisture detection system configured to shutdown operation of the information technology node if condensation is detected.

8. The system of claim 1, wherein the facility cooling water comprises central plant chilled water.

9. A method comprising:
   determining a temperature of air entering an information handling system;
   determining a humidity of the air entering the information handling system;
   determining a temperature of facility cooling water entering the information handling system;
   determining a dew point temperature based on the temperature and humidity of the air; and
   activating a condensation mitigation procedure if a difference between the temperature of the facility cooling water and the dew point temperature is less than a first threshold value stored at the information handling system, the condensation mitigation procedure comprising reducing a flow-rate of the facility cooling water to a liquid manifold using a valve, the liquid manifold in thermally-conductive contact with a heat-generating component included at the information handling system.

10. The method of claim 9, wherein a flow rate regulated by the valve is proportional to the difference between the temperature of the facility cooling water and the dew point temperature.

11. The method of claim 9, further comprising:
   drawing air through the information handling system using a fan; and
   cooling air exhausted from the information using an air-to-liquid heat exchanger receiving the facility cooling water.

12. The method of claim 9, wherein the condensation mitigation procedure is further to assert a warning indicator.

13. The method of claim 9, further comprising:
   updating a system event log identifying a non-critical event in response to determining a difference between the temperature of the facility cooling water and the dew point temperature is greater than the first threshold value and less than a second threshold value.

14. The method of claim 9, further comprising:
   initiating shut down of the information handling system in response to determining a difference between the temperature of the facility cooling water and the dew point temperature is less than a second threshold value stored at the information handling system, the second threshold less than the first threshold.

15. The method of claim 9, further comprising:
   initiating shutdown of the information technology node if condensation is detected at a moisture detection system included at the information handling system.

16. The method of claim 9, wherein the facility cooling water comprises central plant chilled water.

17. An information handling system comprising a non-transitory computer readable medium storing instruction executable by a processor to:
- determine a temperature of air entering the information handling system;
- determine a humidity of the air entering the information handling system;
- determine a temperature of facility cooling water entering the information handling system;
- determine a dew point temperature based on the temperature and humidity of the air; and
- activate a condensation mitigation procedure if a difference between the temperature of the facility cooling water and the dew point temperature is less than a first threshold value stored at the information handling system, the condensation mitigation procedure comprising reducing a flow-rate of the facility cooling water to a liquid manifold using a valve, the liquid manifold in thermally-conductive contact with a heat-generating component included at the information handling system.

18. The system of claim 17, wherein a flow rate regulated by the valve is proportional to the difference between the temperature of the facility cooling water and the dew point temperature.

19. The system of claim 17, further comprising:
- a fan to draw air through the information technology node; and
- an air-to-liquid heat exchanger coupled to the valve, the exchanger configured to receive the facility cooling water and to cool air exhausted from the information technology node.

20. The system of claim 17, wherein the condensation mitigation procedure is further to assert a warning indicator.

* * * * *